United States Patent [19]
Shinohara

[11] Patent Number: 6,073,000
[45] Date of Patent: *Jun. 6, 2000

[54] DIRECT CONVERSION RECEIVING CIRCUIT AND DIRECT CONVERSION RECEIVER

[75] Inventor: Hiroshi Shinohara, Tokyo, Japan

[73] Assignee: Sony Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/678,418

[22] Filed: Jul. 2, 1996

[30] Foreign Application Priority Data

Jul. 13, 1995 [JP] Japan ................... 7-200593

[51] Int. Cl.$^7$ .................................... H04B 1/10
[52] U.S. Cl. .................. 455/310; 455/314; 455/317; 455/318; 455/324
[58] Field of Search .................. 455/314, 310, 455/317, 324, 316, 303, 304, 207, 209, 313, 260, 318

[56] References Cited

U.S. PATENT DOCUMENTS

| | | | |
|---|---|---|---|
| 3,480,865 | 11/1969 | Sanders | 455/316 |
| 4,451,930 | 5/1984 | Chapman et al. | 455/260 |
| 4,944,025 | 7/1990 | Gehring et al. | 455/207 |
| 5,530,929 | 6/1996 | Lindquist et al. | 455/324 |
| 5,548,839 | 8/1996 | Caldwell et al. | 455/313 |

*Primary Examiner*—Lee Nguyen
*Attorney, Agent, or Firm*—Jay H. Maioli

[57] ABSTRACT

The invention provides a superheterodyne receiver by which undesired radiations are minimized. The superheterodyne receiver includes a voltage-controlled oscillator for forming an oscillation signal of a frequency equal to n times a carrier frequency of an object FM signal, and a frequency divider for dividing the frequency of the oscillation signal to the carrier frequency. The superheterodyne receiver further includes a pair of first mixers for frequency converting the object received signal into a pair of first intermediate-frequency signals using signals from the frequency divider as a first local oscillation signal, and a pair of second mixers for converting the first intermediate-frequency signals into a second intermediate-frequency signal with the second local oscillation signals. The superheterodyne receiver further includes a demodulator for demodulating the second intermediate-frequency signal into an original signal.

4 Claims, 3 Drawing Sheets

FIG. 2
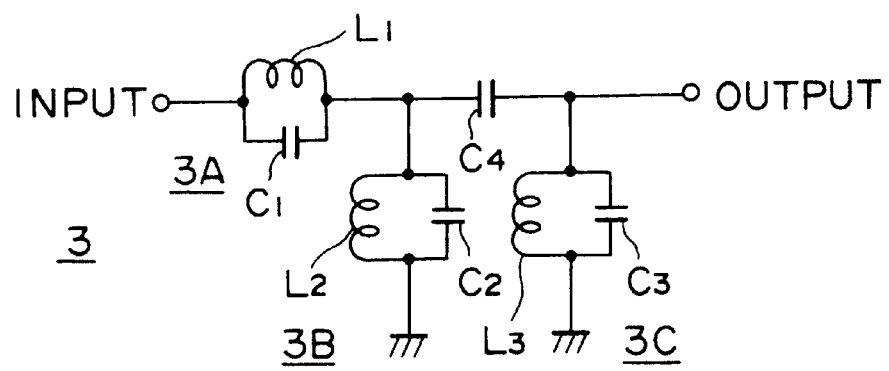
FIG. 3A
FIG. 3B
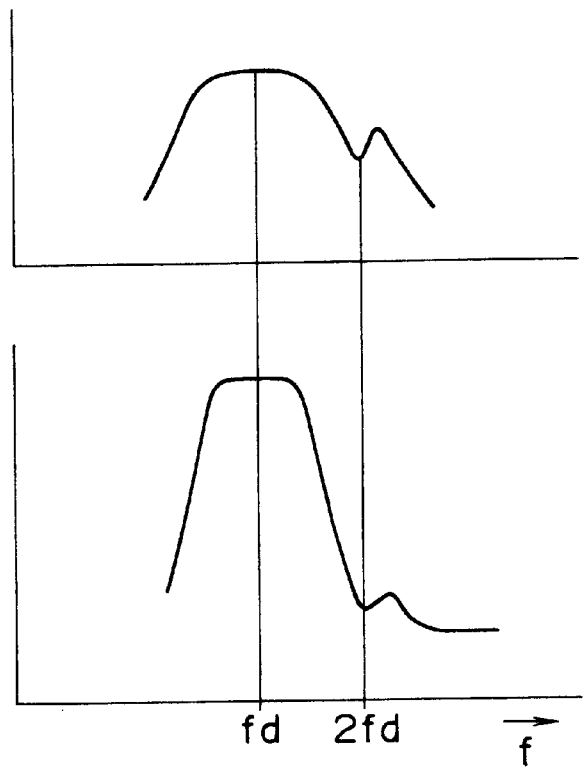

DIRECT CONVERSION RECEIVING CIRCUIT AND DIRECT CONVERSION RECEIVER

BACKGROUND OF THE INVENTION

This invention relates to a superheterodyne receiving circuit and a superheterodyne receiver.

A method is known wherein, in a receiving circuit or receiver of the superheterodyne type, a local oscillation frequency is adjusted so as to be equal to the frequency of a received signal to adjust an intermediate frequency to zero.

Where the method described above is employed, most components of a receiving circuit can be incorporated into a one-chip IC (integrated circuit) as hereinafter described, and consequently, reduction in size and weight, equalization in characteristic and reduction in cost of a receiver can be achieved.

However, with the receiving method described above, since the local oscillation frequency is equal to the frequency of the received signal, the local oscillation signal leaks from the local oscillation circuit via a mixer circuit to the antenna side to increase the level of undesired radiation.

SUMMARY OF THE INVENTION

It is an object of the present invention to provide a superheterodyne receiving circuit and a superheterodyne receiver by which undesired antenna radiations are minimized.

In order to attain the object described above, according to an aspect of the present invention, there is provided a superheterodyne receiving circuit, comprising a voltage-controlled oscillator for generating an oscillation signal having a frequency equal to n times or 1/n times a carrier frequency of an object received signal, n being greater than 1, a frequency divider or multiplier for dividing or multiplying the frequency of the oscillation signal into or up to a frequency equal to the carrier frequency, a first mixer for mixing the object received signal with the divided or multiplied signal output as a first local oscillation signal from the frequency divider or multiplier to produce a first intermediate-frequency signal, a second mixer for mixing the first intermediate-frequency signal with a second local oscillation signal to produce a second intermediate-frequency signal, and a demodulator for demodulating the second intermediate-frequency signal to reproduce an original signal.

According to another aspect of the present invention, there is provided a superheterodyne receiver, comprising an antenna for producing a received signal, a filter for receiving the received signal from the antenna, a voltage-controlled oscillator for generating an oscillation signal having a frequency equal to n times or 1/n times a carrier frequency of an object received signal, n being greater than 1, a frequency divider or multiplier for dividing or multiplying the frequency of the oscillation signal into or up to a frequency equal to the carrier frequency, a first mixer for mixing an output signal of the filter with the divided or multiplied signal output as a first local oscillation signal from the frequency divider or multiplier to produce a first intermediate-frequency signal, a second mixer for mixing the first intermediate-frequency signal with a second local oscillation signal to produce a second intermediate-frequency signal, and a demodulator for demodulating the second intermediate- frequency signal to reproduce an original signal, wherein the filter passes the object received signal but blocks the oscillation signal from the voltage-controlled oscillator.

In the superheterodyne receiving circuit and the superheterodyne receiver, an oscillation signal of the first local oscillation circuit does not leak to the antenna via the mixer at all, and consequently, undesired radiations from the antenna can be reduced. Besides, the loss from the original received signal can be reduced sufficiently. Consequently, both promotion of attenuation of the oscillation signal which produces the undesired radiations and reduction in loss from the original received signal can be achieved.

Further, if the oscillation signal having the n-time frequency leaks from the voltage-controlled oscillator to the first mixer, even if a strong signal is present at the position of the n-time frequency, the original received signal does not suffer from the signal. Further, most components of the superheterodyne receiving circuit or receiver can be incorporated into a one-chip IC. Furthermore, the filter can made adjustment-free.

The above and other objects, features and advantages of the present invention will become apparent from the following description and the appended claims, taken in conjunction with the accompanying drawings in which like parts or elements are denoted by like reference characters.

BRIEF DESCRIPTION OF THE DRAWINGS

FIG. 2 is a circuit diagram showing a form of a band-pass filter shown in FIG. 1;

FIGS. 3A and 3B are diagrams illustrating characteristics of the circuit of FIG. 2;

DESCRIPTION OF THE PREFERRED EMBODIMENT

Figure 1:
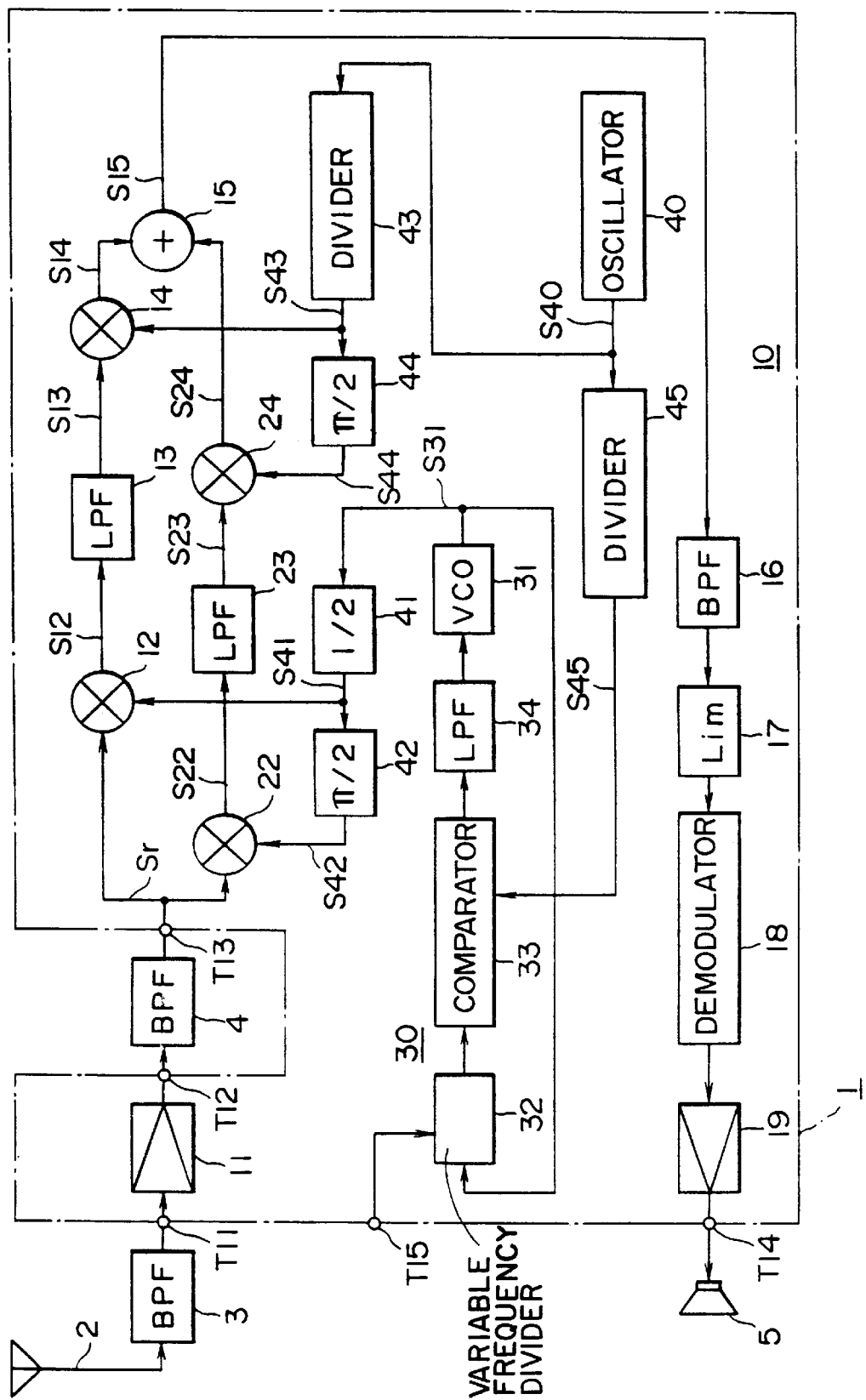
FIG. 1 is a block diagram of a superheterodyne receiver including a superheterodyne receiving circuit showing a preferred embodiment of the present invention.

Referring first to FIG. 1, there is shown a receiving circuit of a child unit of a cordless telephone set of the low power type to which the present invention is applied.

The receiving circuit is denoted at 10, and those components of the receiving circuit 10 surrounded by a chain line denoted at 1 in FIG. 1 are integrated into a one-chip IC. The receiving circuit 10 is formed as a circuit of the double superheterodyne type and the direct conversion type.

In particular, a transmission-reception antenna 2 is connected to a terminal T13 by a signal path including a band-pass filter (BPF) 3, a terminal T11, a high frequency amplifier 11, a terminal T12 and another BPF 4.

In this instance, the BPF 3 is constructed, for example, in such a manner as seen in FIG. 2. Referring to FIG. 2, a parallel resonance circuit 3A is formed of a coil L1 and a capacitor C1 and connected in series to a capacitor C4 between an input terminal and an output terminal of the BPF 3. Another coil L2 and another capacitor C2 form another parallel resonance circuit 3B, and a further coil L3 and a further capacitor C3 form a further parallel resonance circuit 3C. The resonance circuits 3B and 3C are connected, at respective first ends thereof, to the opposite ends of the capacitor C4, and grounded at the other ends.

It is to be noted that the band of a descending channel used by a parent unit of the cordless telephone set is approximately 380.2 MHz to 381.3 MHz, and where the center frequency of the descending channel is represented by fd (fd=approximately 380.7 MHz), the resonance frequency of the resonance circuit 3A is approximately 2fd, and the center frequencies of the parallel resonance circuit 3B and 3C are frequencies around the frequency fd.

Thus, the frequency characteristic of the BPF 3 is such as illustrated in FIG. 3A wherein it allows all descending channel signals centered at the frequency fd to pass the BPF 3 and has a dip in the proximity of the frequency 2fd.

Also the BPF 4 is constructed, for example, in a similar manner to the BPF 3 and has a similar frequency frequency.

Accordingly, the total frequency characteristic of the signal path from the antenna 2 to the terminal T13 is such, for example, as illustrated in FIG. 3B wherein it allows all descending channel signals to pass and has a block band in the proximity of the frequency 2fd.

Referring back to FIG. 1, if an FM signal Sr (carrier frequency fr) of a descending channel is transmitted from the parent unit to the child unit, it is received by the antenna 2 of the child unit and supplied from the antenna 2 to the terminal T13 by the signal path including the BPF 3, terminal T11, high frequency amplifier 11, terminal T12 and BPF 4.

The FM signal Sr supplied to the terminal T13 is then supplied to a pair of first mixers 12 and 22 for the I axis and the Q axis of the orthogonal transform.

A phase-locked loop circuit (PLL) 30 is formed of a voltage-controlled oscillator (VCO) 31, a variable frequency divider 32, a phase comparator 33 and a low-pass filter (LPF) 34 and generates an oscillation signal S31 having a frequency equal to n (n is an integer equal to or greater than 2) times the carrier frequency fr of the FM signal Sr to be received. In the receiving circuit 10 of FIG. 1, for example, n=2, and the PLL 30 generates an oscillation signal S31 having a frequency equal to twice the carrier frequency fr, that is, the frequency 2fr.

The oscillation signal S31 from the VCO 31 is supplied to the variable frequency divider 32. Meanwhile, data of a frequency dividing ratio N corresponding to a channel number of a descending channel to be received is placed into the variable frequency divider 32 via a terminal T15. Thus, the oscillation signal S31 is divided to 1/N in frequency by the variable frequency divider 32, and the thus frequency divided signal is supplied to the phase comparator 33.

Meanwhile, an oscillator 40 generates an oscillation signal S40 of a stable frequency, for example, of 14.4 MHz which makes a reference frequency. The oscillation signal S40 is supplied to a frequency divider 45, by which it is frequency divided to a signal S45 of a frequency equal to $1/576$ that of the oscillation signal S40, that is, a frequency of 25 kHz equal to a channel interval. The signal S45 is supplied as a signal of a reference frequency to the phase comparator 33. A comparison output of the phase comparator 33 is supplied as a control voltage to the VCO 31 via the LPF 34.

The VCO 31 thus produces an oscillation signal S31 of the frequency 2fr equal to twice the carrier frequency fr of the FM signal Sr to be received.

The oscillation signal S31 is supplied to a frequency divider 41, by which it is divided to a signal S41 of a frequency equal to one half that of the oscillation signal S31, that is, a frequency equal to the carrier frequency fr of the FM signal Sr to be received.

The signal S41 is supplied as a first local oscillation signal to the mixer 12 and supplied also to a phase shifter 42, by which the phase thereof is shifted by $\pi/2$. A resulting phase shifted signal S42 from the phase shifter 42 is supplied as a first local oscillation signal to the mixer 22.

Figure 4A:
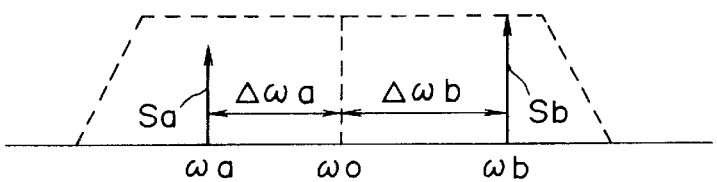
FIGS. 4A and 4B are diagrams illustrating operation of the circuit of FIG. 1.

Accordingly, as seen in FIG. 4A, the received signal Sr has a signal component Sa in a bandwidth of a lower side band thereof and has another signal component Sb in a bandwidth of an upper side band thereof.

Where the carrier frequency (angular frequency of the received signal Sr) is represented by $\omega o$, which is equal to $2\pi$ fr, the angular frequency of the signal component Sa is represented by wa, which is lower than $\omega o$, the amplitude of the signal component Sa is represented by Ea, the angular frequency of the signal component Sb by $\omega b$, which is higher than $\omega o$, and the amplitude of the signal component Sb is represented by Eb and where $\Delta\omega a=\omega o-\omega a$ and $\Delta\omega b=\omega b-\omega o$, Sa and Sb can be represented in the following manner:

$Sr=Sa+Sb$ $Sa=Ea\cdot\sin \omega at$ $Sb=Eb\cdot\sin \omega bt$

Further, where the amplitude of the first local oscillation signals S41 and S42 is represented by E1, they are given by $S41=E1\cdot\sin \omega ot$ $S42=E1\cdot\cos \omega ot$ Accordingly, where the output signals of the mixers 12 and 22 are represented by S12 and S22, respectively, the output signals S12 and S22 are given by $$\begin{aligned}
S12 &= Sr \cdot S41 \\
&= (Ea\cdot\sin\omega at + Eb\cdot\sin\omega bt) \times E1 \cdot \sin\omega ot \\
&= \alpha a\{-\cos(\omega a + \omega o)t + \cos(\omega o - \omega a)t\} + \\
&\quad \alpha b\{-\cos(\omega b + \omega o)t + \cos(\omega b - \omega o)t\} \\
&= \alpha a\{-\cos(\omega a + \omega o)t + \cos\Delta\omega at\} + \\
&\quad \alpha b\{-\cos(\omega b + \omega o)t + \cos\Delta\omega bt\} \\
S22 &= Sr \cdot S42 \\
&= (Ea\cdot\sin\omega at + Eb\cdot\sin\omega bt) \times E1 \cdot \cos\omega ot \\
&= \alpha a\{\sin(\omega a + \omega o)t - \sin(\omega o - \omega a)t\} + \\
&\quad \alpha b\{\sin(\omega b + \omega o)t + \sin(\omega b - \omega o)t\} \\
&= \alpha a\{\sin(\omega a + \omega o)t - \sin\Delta\omega at\} + \\
&\quad \alpha b\{\sin(\omega b + \omega o)t + \sin\Delta\omega bt\} \\
\alpha a &= Ea \cdot E1/2 \\
\alpha b &= Eb \cdot E1/2
\end{aligned}$$

Since the signal components of the angular frequencies $\Delta\omega a$ and $\Delta\omega b$ in the expressions above are necessary intermediate frequency signals, the signals S12 and S22 are supplied to LPFs 13 and 23, from which the signal components of the angular frequencies $\Delta\omega a$ and $\Delta\omega b$ are extracted as first intermediate-frequency signals S13 and S23, respectively. The first intermediate-frequency signals S13 and S23 are given respectively by $S13=\alpha a\cdot\cos \Delta\omega at+\alpha b\cdot\cos \Delta\omega bt$ $S23=-\alpha a\cdot\sin \Delta\omega at+\alpha b\cdot\sin \Delta\omega bt$ It is to be noted that, in this instance, the signals S13 and S23 are signals of the base band as apparently seen also from the equations above and FIG. 4A. Or, the signals S13 and S23 are first intermediate frequency signals whose intermediate frequency is 0.

The signals S13 and S23 are supplied to a pair of the second mixers 14 and 24 for the I axis and the Q axis of orthogonal transform, respectively.

Further, the oscillation signal S40 of the oscillator 40 is supplied to a frequency divider 43, by which it is divided to a signal S43 having a frequency equal to several times the upper limit frequency of hearing, for example, a frequency of approximately 55 kHz which is 1/262 that of the oscillation signal S40. The signal S43 is supplied as a second local oscillation signal to the mixer 14 and supplied also to a phase shifter 44, by which the phase thereof is shifted by $\pi/2$. A resulting phase shifted signal S44 from the phase shifter 44 is supplied as a second local oscillation signal to the mixer 24.

Accordingly, where the amplitude of the second local oscillation signals S43 and S44 is represented by E2 and $\omega s = 2\pi fs$ (fs=approximately 55 kHz), the signals S43 and S44 are given respectively by $$S43 = E2 \cdot \sin \omega s t$$

$$S44 = E2 \cdot \cos \omega s t$$

and where the output signals of the mixers 14 and 24 are represented by S14 and S24, respectively, they are given respectively by $$\begin{aligned} S14 &= S13 \cdot S43 \\ &= (\alpha a \cdot \cos\Delta\omega a t + \alpha b \cdot \cos\Delta\omega b t) \times E2 \cdot \sin\omega s t \\ &= \beta a \{\sin(\Delta\omega a + \omega s)t - \sin(\Delta\omega a - \omega s)t\} + \\ &\quad \beta b \{\sin(\Delta\omega b + \omega s)t - \sin(\Delta\omega b - \omega s)t\} \\ S24 &= S23 \cdot S44 \\ &= (-\alpha a \cdot \sin\Delta\omega a t + \alpha b \cdot \sin\Delta\omega b t) \times E2 \cdot \cos\omega s t \\ &= -\beta a \{\sin(\Delta\omega a + \omega s)t + \sin(\Delta\omega a - \omega s)t\} + \\ &\quad \beta b \{\sin(\Delta\omega b + \omega s)t + \sin(\Delta\omega b - \omega s)t\} \\ \beta a &= \alpha a \cdot E2/2 \\ \beta b &= \alpha b \cdot E2/2 \end{aligned}$$

Then, if the signals S14 and S24 are transformed so that the frequency difference may not have a negative value, then the following equations are obtained:

$$\begin{aligned} S14 &= \beta a \{\sin(\Delta\omega a + \omega s)t + \sin(\omega s - \Delta\omega a)t\} + \\ &\quad \beta b \{\sin(\Delta\omega b + \omega s)t + \sin(\omega s - \Delta\omega b)t\} \\ &= \beta a \cdot \sin(\omega s + \Delta\omega a)t + \beta a \cdot \sin(\omega s - \Delta\omega a)t + \\ &\quad \beta b \cdot \sin(\omega s + \Delta\omega b)t + \beta b \cdot \sin(\omega s - \Delta\omega b)t \\ S24 &= -\beta a \{\sin(\Delta\omega a + \omega s)t - \sin(\omega s - \Delta\omega a)t\} + \\ &\quad \beta b \{\sin(\Delta\omega b + \omega s)t - \sin(\omega s - \Delta\omega b)t\} \\ &= -\beta a \cdot \sin(\omega s + \Delta\omega a)t + \beta a \cdot \sin(\omega s - \Delta\omega a)t + \\ &\quad \beta b \cdot \sin(\omega s + \Delta\omega b)t - \beta b \cdot \sin(\omega s - \Delta\omega b)t \end{aligned}$$

Then, the signals S14 and S24 are supplied to an adder 15, from which an addition signal S15 given by $$\begin{aligned} S15 &= S14 + S24 \\ &= 2\beta a \cdot \sin(\omega s - \Delta\omega a)t + 2\beta b \cdot \sin(\omega s + \Delta\omega b)t \end{aligned}$$

is extracted.

Figure 4B:
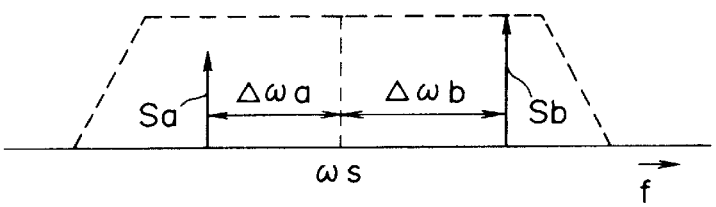

The addition signal S15 is illustrated in FIG. 4B. Referring to FIG. 4B, the signal S15 is no other than a signal obtained when the original received signal Sr is frequency converted into a signal of the carrier frequency (angular frequency) $\omega s$. In other words, the signal S15 is a second intermediate frequency signal of the intermediate frequency fs.

Thus, the second intermediate frequency signal S15 is supplied via a BPF 16 for an intermediate frequency and a limiter amplifier 17 to an FM demodulator 18, by which an original audio signal is obtained by demodulation. The audio signal is supplied via an amplifier 19 and a terminal T14 to a loudspeaker 5 for a telephone receiver.

In this manner, with the receiving circuit 10 described above, an FM signal Sr of a descending channel from the parent unit can be received to obtain an audio signal. Then, in this instance, since the frequency 2fr of the oscillation signal S31 of the VCO 31 is positioned in the band of the blocking frequency 2fd of the BPFs 3 and 4, even if the oscillation signal S31 of the VCO 31 which is acting as a first local oscillating circuit tries to leak to the antenna 2 through the mixer 12 or 22, this is blocked by the BPF 4 or 3 and does not leak to the antenna 2 at all. Accordingly, undesired radiations from the antenna 2 can be reduced.

Besides, since the original received signal Sr has the frequency value fr which is positioned in the pass band of the BPFs 3 and 4, the loss from the received signal Sr can be reduced sufficiently. In other words, both promotion of attenuation of the oscillation signal S31 which produces the undesired radiations and reduction in loss from the original received signal Sr can be achieved.

Further, when the oscillation signal S31 of the frequency 2fr leaks from the VCO 31 to the mixer 12 or 22, if there is a strong signal at the position of the received frequency 2fr, this signal is also frequency converted into the first intermediate-frequency signals S13 and S23 whose intermediate frequency is 0, and interferes with the original received signal Sr. However, the interfering signal of the frequency 2fr is blocked by the BPFs 3 and 4 and is not supplied to the mixers 12 and 22, and consequently, the mixers 12 and 22 do not suffer from such interference.

On the other hand, in an ordinary FM receiver, since its intermediate frequency is 10.7 MHz, the intermediate frequency filter must be formed from a ceramic filter and cannot be incorporated into an IC device.

However, in the receiving circuit 10 described above, since the first intermediate-frequency signals S12 and S22 are base band signals and the second intermediate frequency f15 is as low as, for example, 55 kHz, the filters 13, 23 and 16 can each be formed from an active filter which includes a resistor, a capacitor and an amplifier. Accordingly, the receiving circuit 10 can be formed as an IC, that is, as the IC 1, except the filters 3 and 4 and some elements of the VCO 31.

Further, where the received frequency fr is in the band of the numerical values mentioned hereinabove, since the frequency interval between the pass frequency fd and the block frequency 2fd of the BPFs 3 and 4, even if the pass frequency fd and the block frequency 2fd of them have some error or dispersion, this does not matter, and accordingly, the BPFs 3 and 4 do not require any adjustment.

Figure 5A:
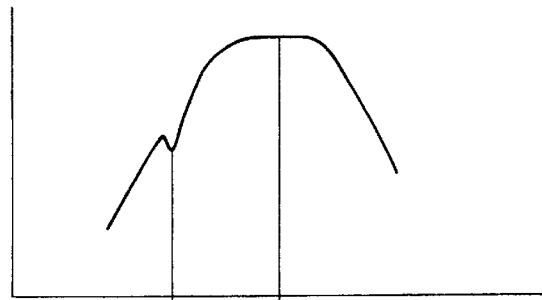
FIGS. 5A and 5B are diagrams illustrating another operation of the circuit of FIG. 1.
Figure 5B:
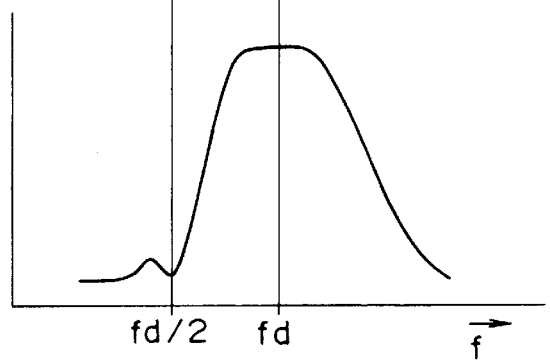

It is to be noted that, while, in the embodiment described above, the present invention is applied to a child unit of a cordless telephone set of the low power type, the present invention can be applied also to a receiving circuit of a parent unit.

Where the frequency fr used is as high as, for example, that in a 1 to 2 GHz band as in another mobile telephone set, the oscillation frequency of the oscillation signal S31 of the VCO 31 is set to 1/n the frequency fr to be received, and the circuit 41 is formed as a multiplying circuit which multiplies the frequency of a signal inputted thereto obtain the signal S41. Further, the band of the blocking frequencies of the BPFs 3 and 4 is set, for example, as seen in FIG. 5A, to a frequency fr/n (=fd/n) equal to 1/n the frequency fr used so that the total frequency characteristic may be such, for example, as seen in FIG. 5B.

Further, an LPF (in the case of FIG. 2) or a high-pass filter (in the case of FIG. 5) can be used in place of each of the BPF 3 and BPF 4.

Having now fully described the invention, it will be apparent to one of ordinary skill in the art that many changes and modifications can be made thereto without departing from the spirit and scope of the invention as set forth herein.

What is claimed is:

1. A direct conversion receiving circuit, comprising:

a voltage-controlled oscillator for generating an oscillation signal having a frequency equal to n times a carrier frequency of an object received signal, n being an integer greater than 1;

a band-pass filter for receiving said object received signal at said carrier frequency, for providing said object received signal as an output signal, and for preventing transmission of a signal in a blocking band of said band-pass filter at a frequency which is n times said carrier frequency of said object received signal, whereby said band-pass filter blocks said oscillation signal;

a frequency divider for dividing the frequency of the oscillation signal into a frequency equal to the carrier frequency to form a first local oscillation signal;

a first phase shifter for shifting said first local oscillation signal by a predetermined phase angle to provide a shifted first local oscillation signal;

a first mixer for mixing the object received signal from said band-pass filter with the first local oscillation signal from said frequency divider to produce a first intermediate-frequency signal;

a second mixer for mixing the object received signal with the shifted first local oscillation signal to produce a shifted first intermediate-frequency signal;

an oscillator producing a second local oscillation signal;

a second phase shifter for shifting said second local oscillation signal by a predetermined phase angle to produce a shifted second local oscillation signal;

a third mixer for mixing the first intermediate-frequency signal with the second local oscillation signal to produce a second intermediate-frequency signal;

a fourth mixer for mixing the shifted first intermediate-frequency signal with the shifted second local oscillation signal to produce a shifted second intermediate frequency signal;

an adder for adding the second intermediate-frequency signal and the shifted second intermediate frequency signal to produce a third intermediate frequency signal; and a demodulator for demodulating the third intermediate-frequency signal to reproduce information contained in the object received signal.

2. A direct conversion receiving circuit, comprising:

a voltage-controlled oscillator for generating an oscillation signal having a frequency equal to 1/n times a carrier frequency of an object received signal, n being an integer greater than 1;

a frequency multiplier for multiplying the frequency of the oscillation signal to a frequency equal to the carrier frequency to form a first local oscillation signal;

a band-pass filter for receiving said object received signal at said carrier frequency, for providing said object received signal as an output signal, and for preventing transmission of a signal in a blocking band of said band-pass filter at a frequency which is 1/n times said carrier frequency of said object received signal, whereby said oscillation signal is blocked;

a first phase shifter for shifting said first local oscillation signal by a predetermined phase angle to provide a shifted first local oscillation signal;

a first mixer for mixing the object received signal from said band-pass filter with the first local oscillation signal from said frequency multiplier to produce a first intermediate-frequency signal;

a second mixer for mixing the object received signal with the shifted first local oscillation signal to produce a shifted first intermediate-frequency signal;

an oscillator for producing a second local oscillation signal;

a second phase shifter for shifting said second local oscillation signal by a predetermined phase angle to produce a shifted second local oscillation signal;

a third mixer for mixing the first intermediate-frequency signal with the second local oscillation signal to produce a second intermediate-frequency signal;

a fourth mixer for mixing the shifted first intermediate-frequency signal with the shifted second local oscillation signal to produce a shifted second intermediate frequency signal;

an adder for adding the second intermediate-frequency signal and the shifted second intermediate frequency signal to produce a third intermediate frequency signal; and a demodulator for demodulating the third intermediate-frequency signal to reproduce information contained in the object received signal.

3. A direct conversion receiver comprising:

an antenna for producing a received signal;

a band-pass filter for receiving the received signal from said antenna, said received signal including an object received signal at a carrier frequency, for providing the object received signal as an output signal, and for providing a minimum response in a blocking band at a frequency which is n times said carrier frequency of said object received signal, n being an integer greater than 1, whereby said oscillation signal is blocked by said band-pass filter;

a voltage-controlled oscillator for generating an oscillation signal having a frequency in said blocking band of said band-pass filter at n times said carrier frequency of said object received signal;

a frequency divider for dividing the frequency of the oscillation signal into a frequency equal to the carrier frequency to form a first local oscillation signal;

a first phase shifter for shifting said first local oscillation signal by a predetermined phase angle to provide a shifted first local oscillation signal;

a first mixer for mixing said output signal of said band-pass filter with the first local oscillation signal from said frequency divider to produce a first intermediate-frequency signal;

a second mixer for mixing the output signal of said band-pass filter with the shifted first local oscillation signal to produce a shifted first intermediate-frequency signal;

an oscillator for producing a second local oscillator signal;

a second phase shifter for shifting said second local oscillation signal by a predetermined phase angle to produce a shifted second local oscillation signal;

a third mixer for mixing the first intermediate-frequency signal with the second local oscillation signal to produce a second intermediate-frequency signal;

a fourth mixer for mixing the shifted first intermediate-frequency signal with the shifted second local oscillation signal to produce a shifted second intermediate frequency signal;

an adder for adding the second intermediate-frequency signal and the shifted second intermediate frequency signal to produce a third intermediate frequency signal; and a demodulator for demodulating the third intermediate-frequency signal to reproduce information contained in the object received signal.

4. A direct conversion receiver comprising:

an antenna for producing a received signal;

a band-pass filter for receiving the received signal from said antenna, said received signal including an object received signal at a carrier frequency, for providing the object received signal as an output signal, and for providing a minimum response in a blocking band at a frequency which is 1/n times said carrier frequency of said object received signal, n being greater than 1, whereby said oscillation signal is blocked by said band-pass filter;

a voltage-controlled oscillator for generating an oscillation signal having a frequency in said band at 1/n times said carrier frequency of said object received signal;

a frequency multiplier for multiplying the frequency of the oscillation signal to a frequency equal to the carrier frequency to form a first local oscillation signal;

a first phase shifter for shifting said first local oscillation signal by a predetermined phase angle to provide a shifted first local oscillation signal;

a first mixer for mixing an output signal of said band-pass filter with the first local oscillation signal from said frequency multiplier to produce a first intermediate-frequency signal;

a second mixer for mixing the output signal of said band-pass filter with the shifted first local oscillation signal to produce a shifted first intermediate-frequency signal;

an oscillator for producing a second local oscillation signal;

a second phase shifter for shifting said second local oscillation signal by a predetermined phase angle to produce a shifted second local oscillation signal;

a third mixer for mixing the first intermediate-frequency signal with the second local oscillation signal to produce a second intermediate-frequency signal;

a fourth mixer for mixing the shifted first intermediate-frequency signal with the shifted second local oscillation signal to produce a shifted second intermediate frequency signal;

an adder for adding the second intermediate-frequency signal and the shifted second intermediate frequency signal to produce a third intermediate frequency signal; and a demodulator for demodulating the third intermediate-frequency signal to reproduce information contained in the object received signal.

* * * * *